United States Patent [19]
Ehrich et al.

[11] Patent Number: 4,966,786
[45] Date of Patent: Oct. 30, 1990

[54] CONDITIONING MEANS FOR PRINTED CIRCUITS

[75] Inventors: Hans-Jürgen Ehrich; Hartmut Mahlkow, both of Berlin, Fed. Rep. of Germany

[73] Assignee: Schering Aktiengesellschaft, Berlin & Bergkamen, Fed. Rep. of Germany

[21] Appl. No.: 231,533

[22] Filed: Aug. 11, 1988

[30] Foreign Application Priority Data

Aug. 11, 1987 [DE] Fed. Rep. of Germany ....... 3727064

[51] Int. Cl.$^5$ .............................................. C23C 26/00
[52] U.S. Cl. ........................................ 427/97; 427/96; 427/98; 427/304; 427/305

[58] Field of Search ..................... 427/97, 96, 98, 304, 427/305

[56] References Cited

U.S. PATENT DOCUMENTS

| | | | |
|---|---|---|---|
| 4,285,991 | 8/1981 | Gedrat | 427/97 |
| 4,301,196 | 11/1981 | McCormack | 427/98 |
| 4,666,739 | 5/1987 | Roubal | 427/97 |
| 4,751,106 | 6/1988 | Wilkinson | 427/97 |

*Primary Examiner*—Shrive Beck
*Assistant Examiner*—Vi Duong Dang
*Attorney, Agent, or Firm*—Michael J. Striker

[57] ABSTRACT

A conditioning means for basis material for producing printing circuits is an alkaline solution of a halogen-free palladium salt and 2-aminopyridine.

6 Claims, No Drawings

CONDITIONING MEANS FOR PRINTED CIRCUITS

BACKGROUND OF THE INVENTION

The present invention relates to a conditioning means for printed circuits. More particularly, it relates to a conditioning means for a basis material for producing printed circuits.

The development in the field of the printed circuit technology during the last several years is characterized by a raging boom which first of all is connected with the tendency to miniaturization. This led to further compression of the wiring circuits which are provided on double-side printed circuit boards with important impression provided in complex multi-layer circuits. Switching conductor trains and switching planes are pressed narrowly against one another and are separated from one another by isolating distances which frequently amount only to 80–150 μm.

In contrast to these developments, the basic material remains in principle unchanged. It is composed of glass fiber reinforced epoxy resin which is provided with filler materials for its reinforcement and on the ground of flame confinement. In the conventional working methods there are growing difficulties in maintaining the remaining thin isolating layers free from damaging influence of for example aggressive media for chemical treatment or metallization. If the distances in the older circuits are measured so that the edge action can be tolerated, in highly miniaturized and space economical modern circuits there is no place available for this. Solutions which not only influence the treatment surface but also act in uncalculable manner in the interior of the material, reduce the insulating action between the bore holes respectively between the bore hole and the switching plane and threaten the whole electric operation of the expensive printed circuits.

In the conditioning as preparation for metallization, the activator plays a central role. Because of it, palladium particles are adsorbed on the isolator surfaces of bore holes to be metallized so as to form the seed points for the following chemical metallization. Conventionally, this process takes place in strongly hydrochloric palladium chloride and tin-II-chloride mixed solution, in which under oxidation of the 2-valent to 4-valent tin the reduction to elementary palladium is performed.

The process has become known which involves hydrochloric medium, such as halogen containing solutions, providing highly damaging action, which is known under the name "wicking" (wick formation) or "replating" (return copper plating). It is based on the fact that by hydrochloric acid or other halogenates each bridge of the glass layer in reverse to its formation is always destroyed so as to produce the bond between glass and resin in a basis material. A capillary is formed, in which the halogen-containing solution penetrates along the glass fiber so that it is moved out of the resin in a wick-like manner. Simultaneously, the activation deeply propagates into the interior of the material, so that "rearwardly" or in other words behind the treatment surface a copper plating also occurs. The higher is the glass web contents of the basic material type, the greater is the damaging action.

A further disadvantage stems from the tin compounds. During a long activation time which is required for the rear layer on the glass for coating produced with a delay, the copper of the end front "overactivates" a cut inner layer. By hydrolizing tin compounds which because of their glutinous consistency adhere to the outer surface, this zone is coated with an especially high amount of palladium seeds, so that an inhibiting layer is formed which prevents a firm bond of the inner layer and the metal sleeve of the bore hole. This is a cause for a separation (post separation) after the thermal loading of the soldering.

When for improvement of the insulating properties of the epoxy resin intermediate layers of polyamide are used as is increasingly typical for rigid/flexible circuits, then in acid halogen-containing medium no adherence can be expected since polyamide in lower pH region is completely indifferent.

These disadvantages must be completely eliminated. When the ether bridges of the glass layers are not attacked, the bond glass/resin is produced in full and thereby the electrical isolation resistance inside the printed circuit board is achieved. The same is true for the delamination, or in other words when copper oxide must not be dissolved. Finally, polyamide which is used increasingly as intermediate layer material must be introduced in the same conditioning mechanism.

DESCRIPTION OF THE INVENTION

Accordingly, it is an object of the present invention to provide a stable conditioning means with use of halogenites which contains palladium in alkaline medium and has an outstanding adsorption property for all basis materials with the exception of copper.

In keeping with these objects and with others which will become apparent hereinafter, one feature of the present invention resides, briefly stated, in that a conditioning means for a basis material for producing printed circuits is an alkaline solution which contains a halogen-free palladium salt and 2-aminopyridine.

The conditioning means in accordance with the present invention contains a complex former for palladium which excellently encompasses the metal in alkaline medium, and due to almost specific adsorption property for board basis material including glass, takes copper metal.

This conditioning means is suitable in a unique manner for pre-treatment of the basis material and especially the bore holes for the purpose of through contacting and formation of conductor paths for printed circuits.

The adsorbing complex is destroyed after its application by reduction, which advantageously can be performed with the use of reduction means on the basis of dimethylaminoboron or sodium hydrite.

The complex decomposes in water soluble ingredients and leaves behind palladium particles of approximately atomic size. A so-called overactuation of the above described type is excluded. In a surprising manner the adsorption of copper is excluded and no foreign substances adhere, since they are easily rinsed as water soluble components.

The conditioning means in accordance with the present invention eliminates all disadvantages which accompanied the utilization of conventional processes. Since it does not use hydrochloric acid, it is not dangerous, it does not act in a corrosive manner and its analytic monitoring is limited to determination of palladium.

Concepts of the near future provide for manufacturing lines in which the printed circuits are horizontally moved over surge nozzles which provide continuous supply of various treatment solutions with high speed.

The positive intimate contact with air prohibits the utilization of oxidation-sensitive activators since tin-2-compounds are oxidized to 4-valent tin and thereby become inoperative.

In contrast, the inventive conditioning means is completely oxidation-insensitive and is best suitable for the utilization in surge or spray processes.

The conditioning of the basis material with the conditioning means in accordance with the present invention is performed in a known manner.

The boards are cleaned, liberated from resin dirtying in the bore holes, purified with an alkaline or acid treatment solution, then sprayed and moreover when desired subjected to etching cleaning.

Then the conditioning with the conditioning means in accordance with the present invention is performed.

The main composition of the aqueous solution to be used in accordance with the present invention is as follows:

0.08-0.2 g/liter, preferably 0.15 g/liter palladium in form of a halogen-free salt, for example a sulfate;

1.5-2.5 g/liter, preferably 1.8 g/liter 2-aminopyridine; and 5-10 g/liter alkalihydroxide, for example sodium hydroxide.

The solution can additionally contain 40 g/liter, preferably 60 g/liter boric acid.

The pH value amounts to 10-13, preferably 10.5.

For reduction means, it is especially advantageous to use dimethylaminoboran and sodium boron hydride with concentrations of 0.5-2 g/liter, preferably 1.0 g/liter.

For chemical and some cases galvanic metallication, the known baths can be used in a known manner.

The printed circuits in which the inventive conditioning means for a basis material is used, are utilized electronics.

The following example is presented to illustrate the present invention.

EXAMPLE

First, in accordance with a conventional method in case of multi-layer circuits, the resin admixture is removed from the bore holes. Then the following working steps are performed also for the double-side printed circuits:

| | | |
|---|---|---|
| Cleaning in a conventional bath type, which is set as alkaline (pH: 13) | 4-6 minutes | 40-65° C. |
| Rinsing | | |
| Cleaning in a conventional bath type, which is set acid (pH: 1) | 4-6 minutes | 25-30° C. |
| Rinsing | | |
| Etch cleaning for cleaning copper surface in a conventional etch cleaning bath | 1-2 minutes | RT |
| Immersing in an immersion bath which must protect the activator from entrainment of foreign ions and stabilize the pH value | 1-2 minutes | RT |
| Conditioning with the inventive solution with 2.47 g of palladium primary solution containing 4 weight percent palladium | 4-6 minutes | 30-40° C. |
| 36.6 weight percent sulfuric acid 96% | | |
| 59.4 weight percent water and | | |
| 0.09 g 2-aminopyridine | | |
| 3.00 g boric acid 99.5% | | |
| 94.44 g water | | |
| 2.3 kg (2 l) of this concentrate is introduced for operational use with continuous stirring in a solution of 60 g sodium hydroxide in 7.6 l water, and finally set with further sodium hydroxide or sulfuric acid to pH 10.5. | | |
| Rinsing | | |
| Reducing in a reductor determined to the activator composed of | 4-6 minutes | 30° C. |
| 11.0 g dimethylaminoboran | | |
| 89.0 g water | | |
| 10 g of this concentrate is applied for operational use with stirring in a solution of 50 g sodium hydroxide in 9.8 l water, pH value: 12. | | |
| Immersion in a 10% diluted reduction solution | | |
| Chemical copper plating in a conventional bath type for producing a first closed copper layer. | | |

Two of so-conditioned bore holes with a small distance of 190 um have a high isolating value corresponding to the type of the material of $10^5$ M $\Omega$.

It will be understood that each of the elements described above, or two or more together, may also find a useful application in other types of substances differing from the types described above.

While the invention has been illustrated and described as embodied in a conditioning means for a basis material for producing printed circuits, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A conditioning means for protecting a basic material of a printed circuit from aggressive treatment solutions during producing the printed circuit by one of surge and spray processes, said conditioning means comprising an oxidation-insensitive alkali solution containing a halogen-free palladium salt and 2-aminopyridine, having a Ph value of 10-11, and further containing a boron acid.

2. A conditioning means as defined in claim 1, wherein said halogen-free palladium salt is a palladium sulfate.

3. A conditioning means as defined in claim 1, wherein said solution has a pH value of 10.5.

4. A conditioning means as defined in claim 1, wherein said solution contains 0.08-0.2 g/l of palladium salt and 1.5-2.5 g/l of 2-aminopyridine.

5. A conditioning means as defined in claim 4, wherein said solution contains 0.15 g/l of palladium.

6. A conditioning means as defined in claim 4, wherein said solution contains 1.8 g/l of 2-aminopyridine.

* * * * *